United States Patent
Yu et al.

(10) Patent No.: US 10,518,503 B2
(45) Date of Patent: Dec. 31, 2019

(54) LAMINATED SUBSTRATE

(71) Applicant: ITEQ CORPORATION, Hsinchu County (TW)

(72) Inventors: Ta-Yuan Yu, Hsinchu County (TW); Kai-Yang Chen, Hsinchu County (TW); Yen-Hsing Wu, Hsinchu County (TW)

(73) Assignee: ITEQ CORPORATION, Hsinchu County (TW)

( * ) Notice: Subject to any disclaimer, the term of this patent is extended or adjusted under 35 U.S.C. 154(b) by 110 days.

(21) Appl. No.: 15/969,922

(22) Filed: May 3, 2018

(65) Prior Publication Data

US 2019/0202168 A1    Jul. 4, 2019

(30) Foreign Application Priority Data

Jan. 2, 2018  (TW) .............................. 107100073 A

(51) Int. Cl.
*B32B 5/26*    (2006.01)
*B32B 15/14*   (2006.01)
*B32B 15/20*   (2006.01)
*H05K 1/03*    (2006.01)

(52) U.S. Cl.
CPC ................ *B32B 5/26* (2013.01); *B32B 15/14* (2013.01); *B32B 15/20* (2013.01); *H05K 1/0366* (2013.01); *B32B 2250/05* (2013.01); *B32B 2260/023* (2013.01); *B32B 2260/046* (2013.01); *B32B 2262/101* (2013.01); *B32B 2307/3065* (2013.01); *B32B 2457/08* (2013.01); *H05K 2201/012* (2013.01)

(58) Field of Classification Search
CPC ............... H05K 1/0366; H05K 1/0373; H05K 2201/012; B32B 2457/08; B32B 2307/3065; B32B 15/20; B32B 15/14; B32B 2260/023; B32B 2260/046; B32B 2260/101; B32B 5/26
USPC ....... 525/523, 481, 405, 505, 533, 504, 409, 525/525, 107, 186, 132, 113, 437; 428/209, 418, 413, 297.4, 292.1, 901, 428/461, 463, 220; 558/82, 76; 523/451, 523/466, 400, 433, 452, 461, 437; 564/16; 174/225, 257; 524/162, 436, 524/437, 405, 122, 451, 503, 404, 508, 524/612, 100, 444, 115, 443, 445, 588; 568/12, 14; 252/609; 528/508, 404, 96, 528/403, 230, 220, 108, 398, 487; 544/73, 90; 549/219; 257/E23.19
See application file for complete search history.

(56) References Cited

U.S. PATENT DOCUMENTS

2013/0161080 A1*  6/2013  Lin .................. C08L 79/04
                                                174/257

FOREIGN PATENT DOCUMENTS

| CN | 102844350 B | 11/2015 |
| TW | 201127899 A1 | 8/2011 |
| TW | 201602321 A | 1/2016 |

* cited by examiner

*Primary Examiner* — Camie S Thompson
(74) *Attorney, Agent, or Firm* — Li & Cai Intellectual Property (USA) Office

(57) ABSTRACT

A laminated substrate including a halogen-free epoxy resin composition. The halogen-free epoxy resin composition includes 100 parts by weight of a halogen-free naphthalene type epoxy resin, 10 to 25 parts by weight of a DOPO modified curing agent, 25 to 45 parts by weight of a cyanate resin, 35 to 60 parts by weight of bismaleimide, 45 to 65 parts by weight of a non-DOPO flame retardant, and 0.5 to 15 parts by weight of a curing accelerator. The laminated substrate of the present disclosure includes a halogen-free epoxy resin composition which has the characteristic of high transition temperature, so that the halogen-free epoxy resin composition has low dielectric constant, low dissipation factor, high heat resistance and high storage modulus.

10 Claims, No Drawings

LAMINATED SUBSTRATE

BACKGROUND

1. Technical Field

The present disclosure relates to a laminated substrate for a printed circuit. In particular, the present disclosure relates to a laminated substrate including a halogen-free epoxy resin composition.

2. Description of Related Art

With the growing trend of communication electronics market, high-speed transmission has become a necessary option. Circuit boards, which are used to carry component, power supply and signal transmission, have become the key factor in the development of the art. However, the epoxy resin and phenolic resin printed circuit board of prior art fail to satisfy the requirements on high-frequency advanced applications. In the technical field of printed circuit boards, thermosetting resin includes mostly epoxy resin and curing agent, and the thermosetting resin is heated along with a reinforcing material (such as a glass fiber fabric) to form prepregs, and the prepregs are laminated with copper foils on its both sides under high temperature and high pressure to form a copper laminated substrate (or the so-called copper foil substrate). Generally, the curing agent of thermosetting resin composition is a phenol novolac resin with hydroxyl (—OH) group, and after reacting with the epoxy resin, the epoxy group of the epoxy resin will open its chain to form a hydroxyl group. The hydroxyl group can increase the dielectric constant and dissipation factor, and is easier to bond with $H_2O$, thus resulting in an increase of moisture absorption.

The existing epoxy resin composition includes a halogen-containing flame retardant (particularly a bromine-containing flame retardant) such as tetrabromocyclohexane, hexabromocyclodecane, 2,4,6-tris(tribromophenoxy))-1,3,5-triazine and so on. Halogen-containing flame retardant has the advantages of better flame retardancy and less usage amounts. However, manufacturing, using, even recycling or discarding halogen products may cause environmental pollution easily. In addition, when burning halogen-containing electronic equipment, corrosive, toxic gases and fumes may generate, and carcinogens such as dioxins, dibenzofuran and other carcinogens are detected after the halogen-containing electronic equipment is burnt. Thus, halogen-free flame retardant printed circuit board has become the key development in this field.

In addition to the development of halogen-free flame-retardant printed circuit boards, the characteristics such as the heat resistance, flame retardancy, low dissipation factor, low hygroscopicity, high crosslinking density, high glass transition temperature, high bondability, appropriate thermal expansion, and so on are the important issues of developing and manufacturing the printed circuit board. Therefore, the selection of epoxy resin, hardener and reinforcement material has become the major factors.

SUMMARY

An exemplary embodiment of the present disclosure provides a laminated substrate, including a resin substrate and a metal foil layer disposed on at least one surface of the resin substrate; wherein the resin substrate includes a plurality of prepregs, wherein each of the prepreg is made of a glass fiber fabric coated with a halogen-free epoxy resin composition; wherein, the halogen-free epoxy resin composition, including: (a) 100 parts by weight of a halogen-free naphthalene based epoxy resin; (b) 10 to 25 parts by weight of DOPO modified curing agent; (c) 25 to 45 parts by weight of cyanate resin; (d) 35 to 60 parts by weight of bismaleimide; (e) 45 to 65 parts by weight of non-DOPO flame retardant; and (f) 0.5 to 15 parts by weight of accelerating agent.

To sum up, the effects of the present disclosure reside in that the technical features of "100 parts by weight of a halogen-free naphthalene based epoxy resin", "10 to 25 parts by weight of DOPO modified curing agent" and "45 to 65 parts by weight of non-DOPO flame retardant" can provide the features of high glass transition temperature, low dielectric constant, low dissipation factor, high heat resistance and high storage modulus.

In order to further understand the techniques, means and effects of the present disclosure, the following detailed descriptions and appended drawings are hereby referred to, such that, and through which, the purposes, features and aspects of the present disclosure can be thoroughly and concretely appreciated; however, the appended drawings are merely provided for reference and illustration, without any intention to be used for limiting the present disclosure.

DESCRIPTION OF THE EXEMPLARY EMBODIMENTS

Reference will now be made in detail to the exemplary embodiments of the present disclosure.

An exemplary embodiment of the present disclosure provides a laminated substrate, including a resin substrate and a metal foil layer disposed on at least one surface of the resin substrate; wherein, the resin substrate includes a plurality of prepregs, wherein each of the prepreg is made of a glass fiber fabric coated with a halogen-free epoxy resin composition.

Specifically, the halogen-free epoxy resin composition, including: (a) 100 parts by weight of a halogen-free naphthalene based epoxy resin; (b) 10 to 25 parts by weight of DOPO modified curing agent; (c) 25 to 45 parts by weight of cyanate resin; (d) 35 to 60 parts by weight of bismaleimide; (e) 45 to 65 parts by weight of non-DOPO flame retardant; and (f) 0.5 to 15 parts by weight of accelerating agent.

In general, the coefficient of thermal expansion of semiconductor components is 3 to 6 ppm/° C. The coefficient of thermal expansion of the naphthalene based epoxy resin is smaller than that of a printed wiring board for conventional semiconductor plastic packages. Therefore, when the semiconductor plastic package undergoes thermal shock, the semiconductor plastic package may be warped due to the difference in coefficient of thermal expansion between the semiconductor component and the printed wiring board, and also, connection defects may further be caused between the semiconductor component and the printed wiring board.

When a rigid fused ring structure is introduced into the epoxy skeleton, the movement of the epoxy ring chain is weakened, the free-volume is reduced, the rigidity of the polymer chain is increased, the bulk density of the cured epoxy resin is enhanced, and the heat resistance of the cured epoxy is improved greatly. The fused ring structure epoxy resin can be categorized according to the structure of naphthalene, anthracene, and pyrene epoxy resin. Anthracene and pyrene epoxy resin have long reaction time, low yield, with lower reactivity and is expensive in raw materials. As the size of the anthracene ring and pyrene ring is larger, the crosslinking density of the resin is highly affected. Thus, the anthracene ring and pyrene ring have limited performance of improving the heat resistance of epoxy resin. In contrast, the naphthalene ring compounds have high reactivity and heat resistance, which is suitable for epoxy resin composition.

Specifically, the naphthalene ring structure of a naphthalene based epoxy resin has high heat resistance, low coefficient of thermal expansion (CTE), and low moisture absorption. Preferably, the halogen-free naphthalene based epoxy resin is selected from the group consisting of di-naphthalene based epoxy resin, tetra-naphthalene based epoxy resin and oxazolidone-containing di-naphthalene based epoxy resin, as shown in the following structure:

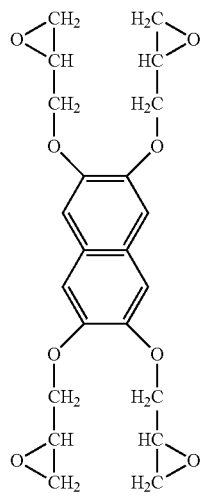
(di-naphtalene based epoxy resin)

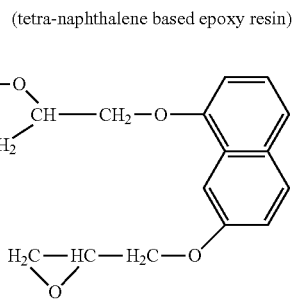
(tetra-naphthalene based epoxy resin)

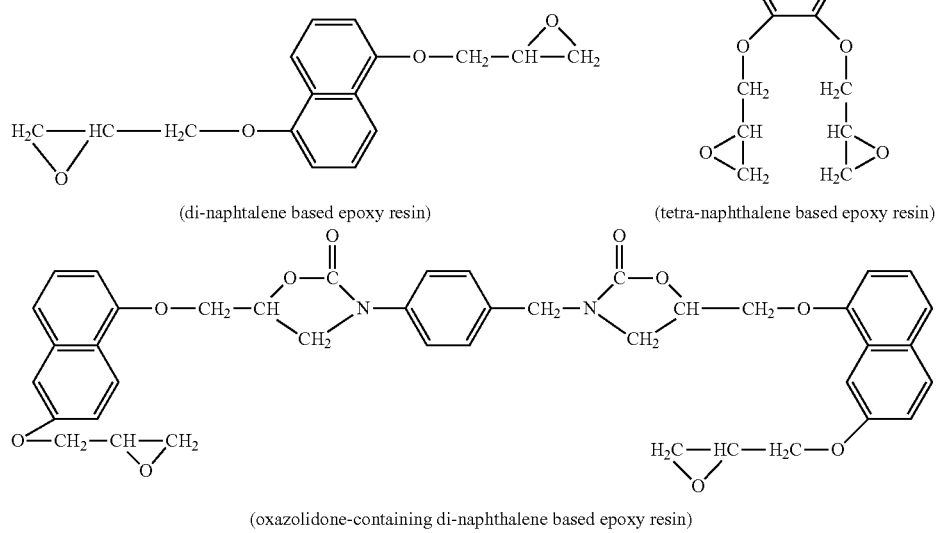
(oxazolidone-containing di-naphthalene based epoxy resin)

9,10-dihydro-9-oxa-10-phosphaphenanthrene-10-oxide (DOPO) modified curing agent in the present disclosure is used to react with an epoxy resin as a curing agent. The modified curing agent provides high thermal stability, low dielectric properties, and enhances the flame retardant effect. The DOPO modified curing agent of the present disclosure is selected from the group consisting of DOPO-hydroquinone resin, DOPO-naphthalene diol resin, DOPO-novolac resin and DOPO-bisphenol novolac resin. Furthermore, the DOPO-containing bisphenol novolac resin is selected from the group consisting of DOPO-containing bisphenol A novolac resin (DOPO-BPAN), DOPO-containing bisphenol F novolac resin (DOPO-BPFN), and DOPO-containing bisphenol S novolac resin (DOPO-BPSN).

The cyanate resin increases the reactive functional groups in the resin structure, further improves the crosslinking density of the epoxy cured compounds, decreases the free-volume of the halogen-free epoxy resin composition, and improves the heat resistance; however the cyanate resin in the present disclosure is not limited thereto. For example, the cyanate resin may be polyfunctional aliphatic isocyanate compounds, polyfunctional alicyclic isocyanate compounds, polyfunctional aromatic isocyanate compounds such as trimethylene diisocyanate, tetramethylene diisocyanate, methylene diisocyanate, pentamethylene diisocyanate, 1,2-propylene diisocyanate, 1,3-butylene diisocyanate, dodecamethylene diisocyanate, 2,4,4-trimethyl Hexamethylene diisocyanate and the like, 1,3-cyclopentene diisocyanate, 1,3-cyclohexane diisocyanate, 1,4-cyclohexane diisocyanate, isophorone diisocyanate, hydrogenated diphenylmethane Diisocyanates, hydrogenated xylylene diisocyanate, hydrogenated tolylene diisocyanate, hydrogenated tetramethylxylylene diisocyanate, phenylene diisocyanate, 2,4-tolylene diisocyanate, 2,6-tolylene diisocyanate, 2,2'-diphenylmethane diisocyanate, 4,4'-diphenylmethane diisocyanate, 4,4'-toluidine diisocyanate, 4,4'-diphenyl ether diisocyanate, 4,4'-diphenyldiisocyanate, 1,5-naphthalene diisocyanate, benzene Methylene diisocyanate, and the like.

The bismaleimide is mainly a compound containing two maleimide groups in the molecule and also possible to select prepolymer of bismaleimide compounds, or bis prepolymer of maleimide compounds and amine compounds, but the present disclosure is not limited thereto. Preferably, the bismaleimide is selected from the group consisting of bis (4-phenylmaleimide)methane, 2,2-bis(4-(4-phenoxymaleimide)-phenyl)propane, bis(3,5-dimethyl-4-phenylmaleimide)methane, bis(3-ethyl-5-methyl-4-phenylmaleimide), and (3,5-diethyl-4-phenylmaleimide) methane.

The flame retardant of the halogen-free epoxy resin composition of the present disclosure is a non-DOPO flame retardant, which does not contain 9,10-dihydro-9-oxa-10-phosphaphenanthrene-10-oxide. In detail, the P—O—C bond in the DOPO structure is easily hydrolyzed to be P—OH, which leads to increase of the dielectric constant and the dissipation factor of materials. Therefore, the non-DOPO flame retardant can avoid the increase of dielectric constant (Dk) and dissipation factor (Df) of materials.

Preferably, the non-DOPO flame retardant is selected from the group consisting of compounds of formula (I), (II) and (III):

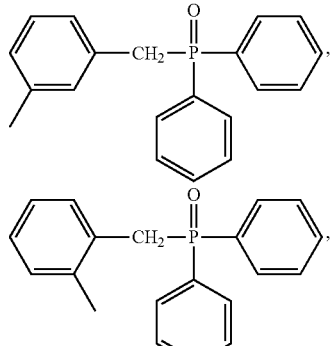

wherein $R_1$ is

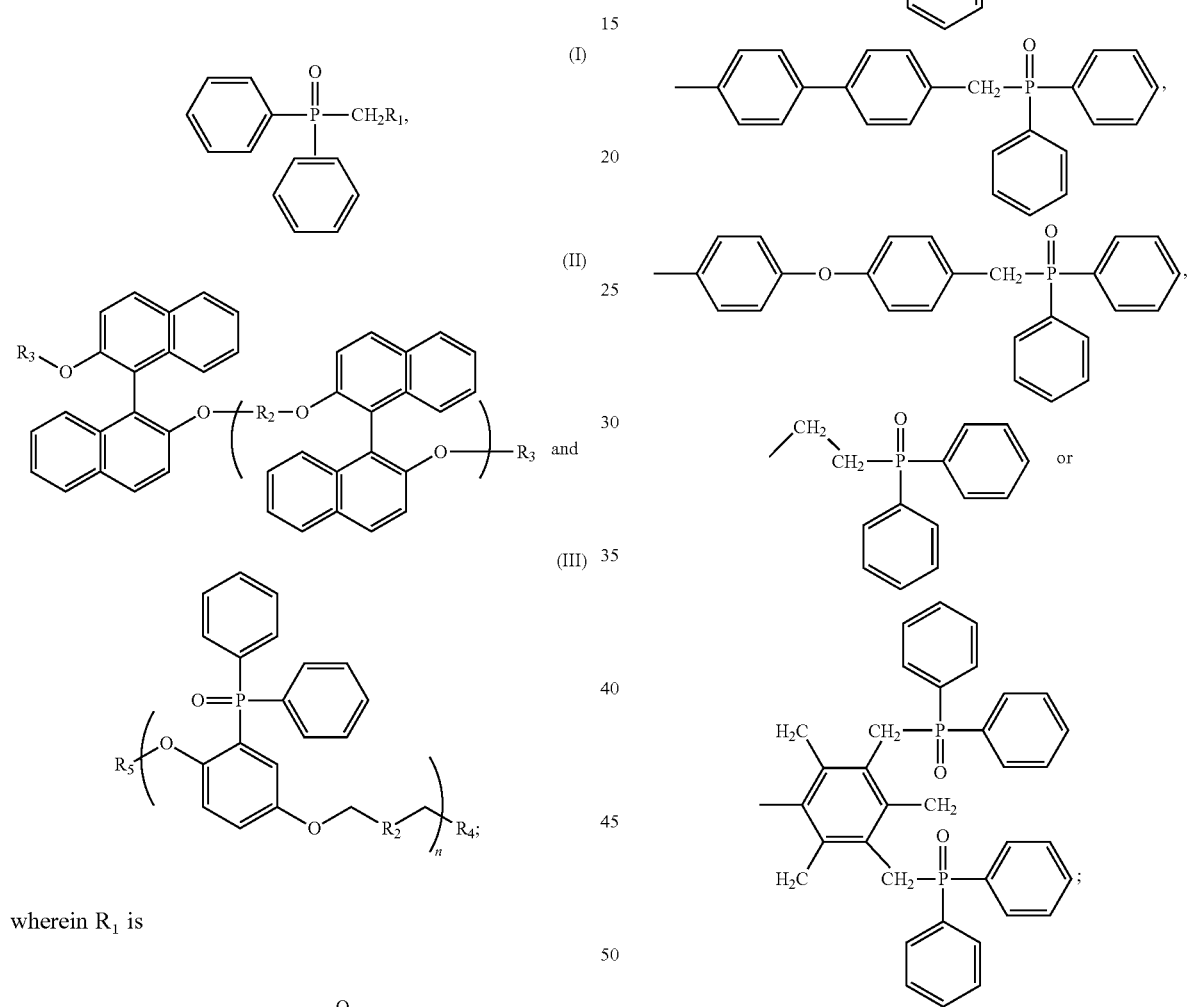

wherein $R_2$ is wherein $R_3$ is

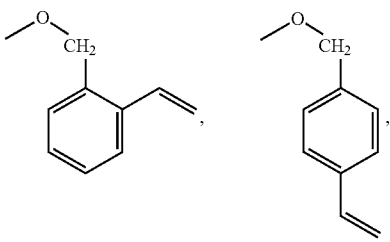

or $CH_2CH_2OCH=CH_2$;
wherein n is an integer from 0 to 500;
wherein $R_4$ is

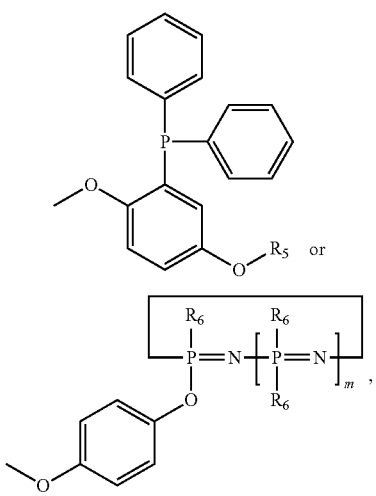

and $m \geq 1$;
wherein $R_5$ is

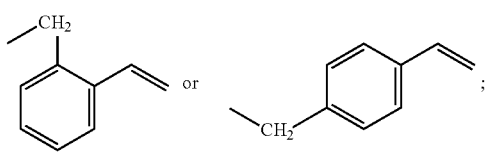

and wherein $R_6$ is

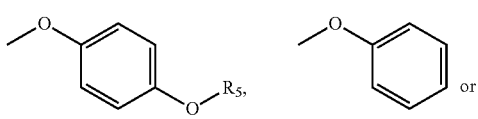

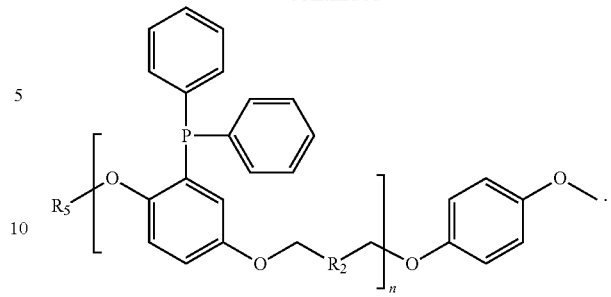

In addition, the halogen-free epoxy resin composition of the present disclosure further includes a flame retardant compound, and the flame retardant compound is selected from the group consisting of resorcinol dixyl phosphate (RDXP such as PX-200), melamine polyphosphate, tris(2-carboxyethyl)phosphine (TCEP), trimethyl phosphate (TMP), tris(isopropyl chloride) phosphate, dimethyl-methyl phosphate (DMMP), bisphenol biphenyl phosphate, ammonium polyphosphate, hydroquinone-bis-(biphenyl phosphate) and bisphenol A-bis-(biphenyl phosphate)

Preferably, at least one or a mixture of the accelerating agent of the present disclosure is selected from the group consisting of imidazole, metal salt, tertiary amines or piperidines. Furthermore, the accelerating agent may be selected from boron trifluoride amine complex, 2-ethyl-4-methylimidazole (2E4MI), 2-methylimidazole (2MI), 2-phenyl-1H-imidazole (2PZ), ethyltriphenyl phosphonium chloride, triphenylphosphine (TPP), cobalt (II) acetylacetonate, 4-dimethylamino 4-dimethylaminopyridine (DMAP), low molecular weight terminal bromine-based liquid butadiene rubber (BTPB), organic metal salts such as cobalt (II) bisacetylacetonate, cobalt (III), tertiary amines such as triethylamine, tributylamine, and diazabicyclo [2,2,2] octane and the like. More preferably, the accelerating agent is a mixture of 2-phenylimidazole and cobalt bis(acetylacetonate)(II). Specifically, the imidazole compound has better compatibility with the resin component, so that a cured product having high uniformity can be obtained.

The inorganic filler can increase the thermal conductivity of the halogen-free epoxy resin composition, and improve the thermal expansibility and mechanical strength. Preferably, the inorganic filler is uniformly distributed in the halogen-free epoxy resin composition. Preferably, the inorganic filler can be performed with a surface treatment by a silane coupling agent in advance. Preferably, the inorganic filler can be spherical, flake, granule, column, plate, needle or irregular inorganic filler. Preferably, the inorganic filler is selected from the group consisting of silicon dioxide (such as fused, non-molten, porous or hollow silica), aluminum oxide, aluminum hydroxide, magnesium oxide, magnesium hydroxide, calcium carbonate, aluminum nitride, boron nitride, aluminum silicon carbide, silicon carbide, titanium dioxide, zinc oxide, zirconium oxide, Barium, magnesium carbonate, barium carbonate, mica, talc, and graphene.

In addition, the halogen-free epoxy resin composition of the present disclosure further includes a suitable solvent, such as ketones, esters, ethers, alcohols and the like. Specifically, the solvent of the present disclosure is selected from the group consisting of acetone, butanone, propylene glycol methyl ether, propylene glycol methyl ether acetate, dimethylethyl amine and cyclohexanone.

Another embodiment of the present disclosure provides a laminated substrate, including: a resin substrate, comprising a plurality of prepregs, wherein each of the prepreg is made of a glass fiber fabric coated with the halogen-free epoxy resin composition according to the present disclosure; and a metal foil layer disposed on at least one surface of the resin substrate.

Still another embodiment of the present disclosure provides a printed circuit board, comprising the laminated substrate according to the present disclosure.

In order to illustrate the specific proportions of the composition of the present disclosure, which leads to the best properties of the laminated substrate, the following are the examples and comparative examples of the halogen-free epoxy resin composition of the present disclosure.

EXAMPLES

The following Examples E1 to E5 show the halogen-free epoxy resin composition of the present disclosure, which are used to manufacture prepregs in a continuous process. Generally, a glass fiber fabric is used as a base material, and the roll-like glass fiber fabric passes continuously into the impregnating tank containing the halogen-free epoxy resin composition according to the present disclosure through a series of rollers. In the impregnating tank, the glass fiber fabric is fully impregnated with the halogen-free epoxy resin composition provided by the present disclosure. After scraping off an excess of resin composition by a metering roller, the glass fiber fabric is then baked for a period of time in an oven to evaporate the solvent and semi-cure the resin composition. Then, the glass fiber fabric coated with the resin composition is cooled and rolled to form a prepreg. Take four sheets of the above-mentioned prepregs and two sheets of 18 μm copper foils, in order of one copper foil, four prepregs and one copper foil are stacked in sequence and pressed for 2 hours in vacuum at 220° C. to form a copper foil substrate, wherein the four sheets of fully cured prepregs are formed and become an insulating layer between the two copper foils.

TABLE 1

| | Composition | E1 | E2 | E3 | E4 | E5 |
|---|---|---|---|---|---|---|
| Epoxy resin | NPTE4000 | 40 | 40 | 40 | 30 | 30 |
| | HP-6000 | 60 | 60 | 60 | 70 | 70 |
| DOPO modified curing agent | DOPO-BPAN (DOPO-containing bisphenol A novolac resin) | 0 | 10 | 15 | 20 | 25 |
| Cyanate resin | BA230S (bisphenol cyanate resin) | 45 | 40 | 35 | 30 | 25 |
| Bismaleimide | BMI-5100(bismaleimide) | 55 | 50 | 45 | 40 | 35 |
| Flame retardant | compound of formula (I) | 50 | — | — | 25 | 15 |
| | compound of formula (II) | — | 50 | — | 15 | 15 |
| | compound of formula (III) | — | — | 50 | 15 | 25 |
| Flame retardant compound | PX-200 (resorcinol dixylenyl phosphate) | 10 | 10 | 10 | 10 | 10 |
| Inorganic filler | Flake silicon dioxide | — | 33 | — | 40 | — |
| | Spherical silicon dioxide | 33 | — | 40 | — | 40 |
| Accelerating agent | Cobaltic acetylacetonate(III) | 6 | 6 | 6 | 3 | 3 |
| | 2E4MI (2-ethyl-4-methylimidazole) | 1 | 1 | 1 | 1 | 1 |
| | 2-phenylimidazole | 3 | 3 | 3 | 6 | 6 |

TABLE 1-continued

| | Composition | E1 | E2 | E3 | E4 | E5 |
|---|---|---|---|---|---|---|
| Solvent | MEK (methyl ethyl ketone) | 45 | 45 | 45 | 50 | 50 |
| | DMAc (dimethylacetamide) | 30 | 30 | 30 | 20 | 20 |
| | PM(propylene glycol monomethyl ether) | 25 | 25 | 25 | 30 | 30 |

NPTE4000 naphthalene based epoxy resin:

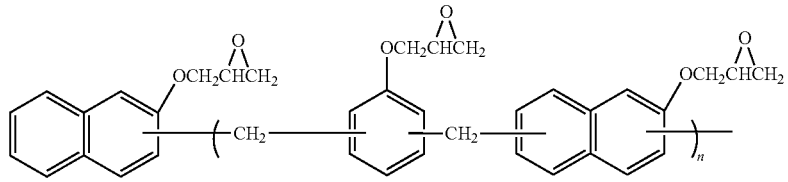

*HP-6000 naphthalene based epoxy resin (Purchased from DIC corporation, Japan)

Comparative Example

The Comparative Examples were prepared in a continuous process according to the following components of the Comparative Examples C1 to C5 in Table 2. Generally, a glass fiber fabric is used as a base material, and the roll-like glass fiber fabric passes continuously into the impregnating machine containing the halogen-free epoxy resin composition according to the present disclosure through a series of rollers. In the impregnating tank, the glass fiber fabric is fully impregnated with the halogen-free epoxy resin composition. After scraping off an excess of resin composition by a metering roller, the glass fiber fabric is then baked for a period of time in an oven to evaporate the solvent and semi-cure the resin composition. Then, the glass fiber fabric coated with the resin composition is cooled and rolled to form a prepreg. Take four sheets of the above-mentioned prepregs and two sheets of 18 μm copper foils, in order of one copper foil, four prepregs and one copper foil are stacked in sequence and pressed for 2 hours in vacuum at 220° C. to form a copper foil substrate, wherein the four sheets of fully cured prepregs are formed and become an insulating layer between the two copper foils.

TABLE 2

| | Composition | C1 | C2 | C3 | C4 |
|---|---|---|---|---|---|
| Epoxy resin | HP-7200 | 40 | 40 | 40 | 40 |
| | NC-3000 | 60 | 60 | 60 | 60 |
| Maleic anhydride curing agent | Styrene maleic anhydride (SMA) EF60 | 30 | 25 | 20 | 10 |
| Benzoxazine resin | LZ8280 | 45 | 50 | 50 | 55 |
| Flame retardant | compound of formula (I) | 45 | — | — | 15 |
| | compound of formula (II) | — | 45 | — | 15 |
| | compound of formula (III) | — | — | 45 | 15 |
| Flame retardant compound | PX-200 (resorcinol dixylenyl phosphate) | 10 | — | 10 | — |
| | TCEP(tris(2-chloroethyl) phosphate) | — | 10 | — | 10 |
| Inorganic filler | Spherical silicon dioxide | 40 | 40 | 40 | 40 |
| Accelerating agent | 2E4MI (2-ethyl-4-methylimidazole) | 1 | 1 | 1 | 1 |

TABLE 2-continued

| Composition | | C1 | C2 | C3 | C4 |
|---|---|---|---|---|---|
| Solvent | MEK(methyl ethyl ketone) | 60 | 60 | 30 | 30 |
| | PMA (propylene glycol methyl ether ethyl ester) | 30 | 30 | 60 | 60 |

* HP-7200: DCPD (dicyclopentadiene) type epoxy resin
* NC-3000: biphenyl epoxy resin from Nippon Kayaku Co., Ltd.
* LZ-8280: bisphenol F benzoxazine resin from Huntsman Corporation

[Physical Properties Analysis]

The copper foil substrate according to the above Examples E1 to E5 and Comparative Examples C1 to C5 were tested for physical properties and the test results are recorded in Table 3:

(1) Glass transition temperature (Tg): it is determined by the differential scanning calorimetry (DSC) according to the IPC-TM-650 2.4.25C method.

(2) Heat resistance of copper laminated substrate (T288): it is also known as "solder float result". The heat resistance test for the copper laminated substrate is to soak the copper laminated substrate in the Tin stove at 288° C. to observe the presence of delamination, and the time which the delamination presents is measured according to the industry standard IPC-TM-650 2.4.24.1 method.

(3) Moisture copper laminated substrate Tin test: the prepregs with copper foil is performed with the heat resistance test (T288), and the copper laminated substrate is soaked in the Tin stove at 288° C. to observe the presence of delamination. Here, the heat resistance test is made according to the industry standard IPC-TM-650 2.4.24.1 method, and the time which the delamination presents is measured according to the industry standard IPC-TM-650 2.4.24.1 method.

(4) Moisture absorption: as the copper laminated substrate will expand or adsorb moisture due to the influence of the environmental temperature and the ambient humidity and high moisture content or high humidity will cause easily delamination or other circuit board defects of the copper laminated substrate, it is necessary to determine the absorption of water of the copper laminated substrate. Traditionally, the water absorption of the copper laminated substrate is determined by IR spectroscopy and thermo gravimetric analysis.

(5) Peeling strength between copper foil and substrate (P/S): it is determined according to the standard IPC-TM-650 2.4.1 method.

(6) Dielectric constant (Dk): it is determined according to the IPC-TM-650 2.5.5 method. The dielectric constant indicates the insulation property of the prepreg. The lower the dielectric constant is, the better the insulation property of the prepreg is.

(7) Dissipation factor (DO: it is determined according to the IPC-TM-650 2.5.5 method. Dissipation factor indicates the absorption of a certain range of a microwave by a material under a certain temperature. According to the standards for the communicational products, the lower value of the dissipation factor represents a better performance.

(8) Flammability test (UL94): the test of flammability follows the instruction of UL94 vertical flame test method, which determines the time of spontaneous combustion, the speed of spontaneous combustion, and the level of dripped flaming particles once the plastic specimen has been ignited. According to the classifications of the flammability, the testing results are rated from lowest (least flame-retardant) to highest (most flame-retardant) as HB, V-2, V-1, V-0 ... and 5V, and the anti-flammability of prepregs is determined in accordance with the classifications. The prepreg to be tested is burnt on the fire source vertically and the test procedure lasts for ten seconds, and the steps are as follows: Step 1: Burning the prepreg for 10 seconds, and then moving the prepreg away from the fire source while simultaneously counting the time period (T1) that the prepreg continues to burn after being removed from the fire source; Step 2: Burning the prepreg for 10 seconds again after the fire source of Step 1 is extinguished, then moving the prepreg away while simultaneously counting the time period (T2) that the prepreg continues to burn after being removed from the fire source; Step 3: Repeating step 1 and step 2, and calculating the mean value of T1 and T2; and Step 4: Summing the mean value of T1 and T2. According to the V-0 classification defined in UL 94, neither of the mean value of T1 and T2 is larger than 10 seconds and the sum of the mean value of T1 and T2 is no more than 50 seconds, indicating that the prepreg complies with the V-0 classification.

(9) X or Y axis coefficient of thermal expansion (CTE) of substrate insulating layer: It is measured according to the IPC-TM-650-2.4.24 method.

(10) The storage modulus of the substrate insulating layer (measured by DMA instrument according to the IPC-TM-650-2.4.24.2 method): It is greater than or equal to 5000 MPa at about 250° C.

TABLE 3

| Condition | Method | E1 | E2 | E3 | E4 | E5 | C1 | C2 | C3 | C4 |
|---|---|---|---|---|---|---|---|---|---|---|
| Glass transition temperature (Tg) | DSC | 247 | 249 | 251 | 249 | 250 | 168 | 163 | 165 | 166 |
| Heat resistance of copper laminated substrate (T288) | TMA | >60 | >60 | >60 | >60 | >60 | >30 | >30 | >50 | >60 |
| PCT (dip minute) | 1 hr/120° C. | >60 | >60 | >60 | >60 | >60 | >60 | >60 | >60 | >60 |
| Water absorption % | PCT/121° C./1 hr | 0.39 | 0.41 | 0.40 | 0.42 | 0.40 | 0.53 | 0.55 | 0.58 | 0.60 |
| P/S (lb/min) | Hoz Cu foil | 7.9 | 7.7 | 8.0 | 7.8 | 8.1 | 5.2 | 5.8 | 5.5 | 6.1 |
| $D_k$@10 GHz | 10 GHz | 4.59 | 4.61 | 4.60 | 4.58 | 4.62 | 4.54 | 4.6 | 4.68 | 4.63 |
| $D_f$@10 GHz | 10 GHz | 0.0066 | 0.0068 | 0.0069 | 0.0068 | 0.007 | 0.0089 | 0.009 | 0.0092 | 0.0097 |
| Flammability | UL94 | V-0 | V-0 | V-0 | V-0 | V-0 | V-0 | V-0 | V-0 | V-0 |
| CTE($\alpha$1, X-axis, ppm/° C.) | TMA | 5.8 | 5.4 | 5.6 | 5.2 | 5.5 | 13 | 15 | 16 | 15 |
| CTE($\alpha$1, Y-axis, ppm/° C.) | TMA | 4.2 | 4.3 | 4.0 | 4.3 | 4.1 | 14 | 15 | 15 | 16 |

TABLE 3-continued

| Condition | Method | E1 | E2 | E3 | E4 | E5 | C1 | C2 | C3 | C4 |
|---|---|---|---|---|---|---|---|---|---|---|
| Storage modulus (GPa, DMA, @50/260° C.) | DMA X/Y axis | 21.62/ 14.46 | 22.05/ 14.09 | 22.33/ 14.40 | 21.82/ 14.21 | 22.28/ 14.30 | 13.62/ 4.46 | 14.55/ 5.09 | 12.63/ 5.20 | 13.88/ 4.24 |

The present disclosure provides a laminated substrate including a halogen-free epoxy resin composition with specific compositions and ratios, and the halogen-free epoxy resin composition has the characteristics of high glass transition temperature, low dielectric constant, low dissipation factor, high heat resistance and high storage modulus.

In summary, the effect of the present disclosure reside in that the technical features of "100 parts by weight of a halogen-free naphthalene based epoxy resin", "10 to 25 parts by weight of DOPO modified curing agent" and "45 to 65 parts by weight of non-DOPO flame retardant" can provide the epoxy resin composition without halogen, and it has the features of high glass transition temperature, low dielectric constant, low dissipation factor, high heat resistance and high storage modulus.

Moreover, the halogen-free epoxy resin composition of the present disclosure can improve the heat resistance and reduce the coefficient of thermal expansion of the halogen-free epoxy resin composition by using the naphthalene based epoxy resin. In addition, the DOPO modified curing agent not only provides good thermal stability and low dielectric properties, but also enhances the effectiveness of flame retardants. Furthermore, the non-DOPO flame retardant can avoid increasing the Dk and Df of the halogen-free epoxy resin composition.

The above-mentioned descriptions represent merely the exemplary embodiment of the present disclosure, without any intention to limit the scope of the present disclosure thereto. Various equivalent changes, alterations or modifications based on the claims of the present disclosure are all consequently viewed as being embraced by the scope of the present disclosure.

What is claimed is:

1. A laminated substrate, comprising:
   a resin substrate, comprising a plurality of prepregs, wherein each of the prepreg is made of a glass fiber fabric coated with the halogen-free epoxy resin composition; and
   a metal foil layer disposed on at least one surface of the resin substrate; wherein, the halogen-free epoxy resin composition includes:
   (a) 100 parts by weight of a halogen-free naphthalene based epoxy resin;
   (b) 10 to 25 parts by weight of DOPO modified curing agent;
   (c) 25 to 45 parts by weight of cyanate resin;
   (d) 35 to 60 parts by weight of bismaleimide;
   (e) 45 to 65 parts by weight of non-DOPO flame retardant; and
   (f) 0.5 to 15 parts by weight of accelerating agent.

2. The laminated substrate according to claim 1, wherein the halogen-free naphthalene based epoxy resin is selected from the group consisting of di-naphthalene based epoxy resin, tetra-naphthalene based epoxy resin and oxazolidone-containing di-naphthalene based epoxy resin.

3. The laminated substrate according to claim 1, wherein the DOPO modified curing agent is selected from the group consisting of DOPO-hydroquinone resin, DOPO-naphthalene diol resin, DOPO-novolak resin and DOPO-bisphenol novolac resin.

4. The halogen-free epoxy resin composition according to claim 3, wherein the DOPO-containing bisphenol novolac resin is selected from the group consisting of DOPO-containing bisphenol A novolac resin, DOPO-containing bisphenol F novolac resin, and DOPO-containing bisphenol S novolac resin.

5. The laminated substrate according to claim 1, wherein the bismaleimide is selected from the group consisting of bis(4-phenylmaleimide)methane, 2,2-bis(4-(4-phenoxymaleimide)-phenyl)propane, bis(3,5-dimethyl-4-phenylmaleimide)methane, bis(3-ethyl-5-methyl-4-phenylmaleimide), and (3,5-diethyl-4-phenylmaleimide)methane.

6. The laminated substrate according to claim 1, wherein the non-DOPO flame retardant is selected from the group consisting of compounds of formula (I), (II) and (III):

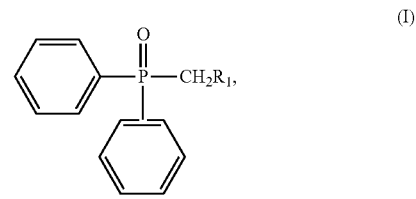

(I)

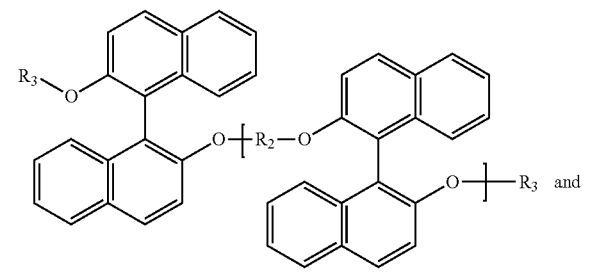

(II)

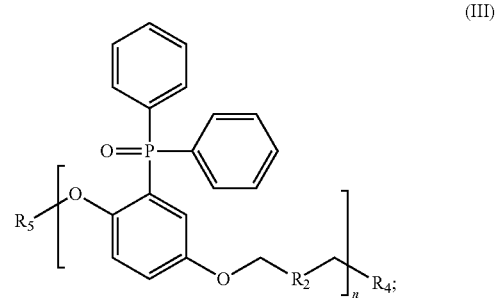

(III)

wherein $R_1$ is
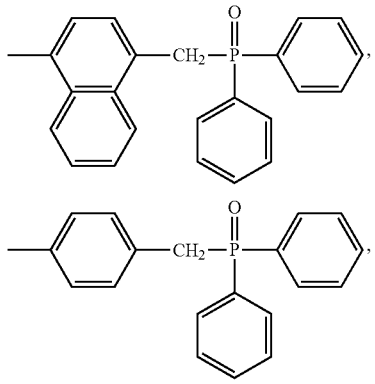
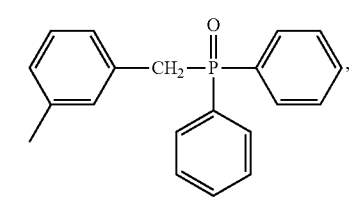
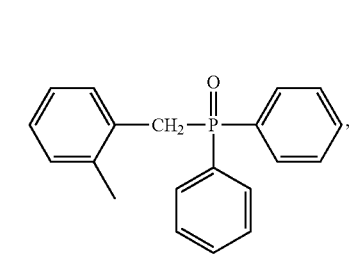
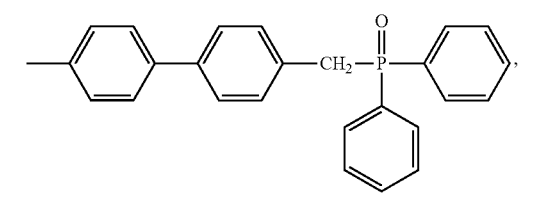
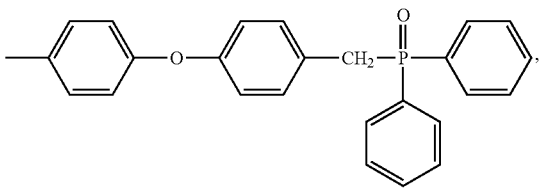
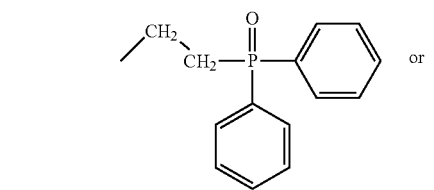
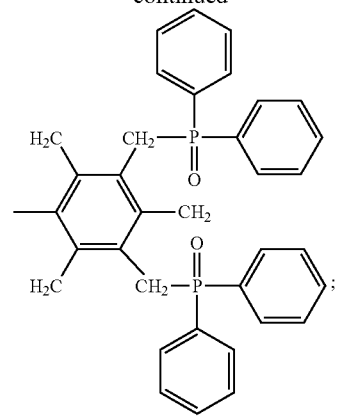
wherein $R_2$ is
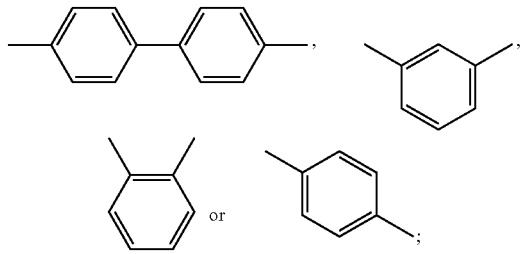
wherein $R_3$ is
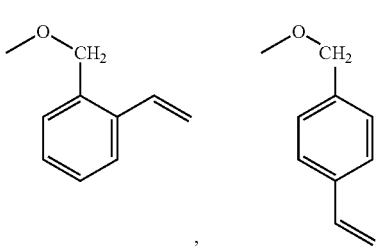
or $CH_2CH_2OCH{=}CH_2$;
wherein n is an integer from 0 to 500;
wherein $R_4$ is
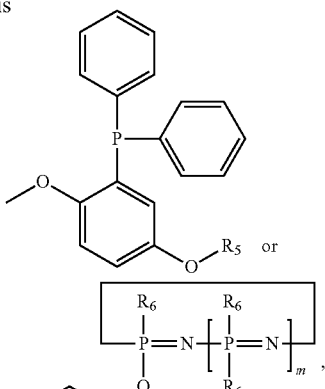

and m≥1;
wherein $R_5$ is

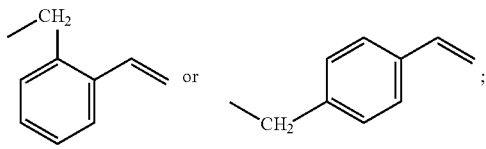

and wherein $R_6$ is

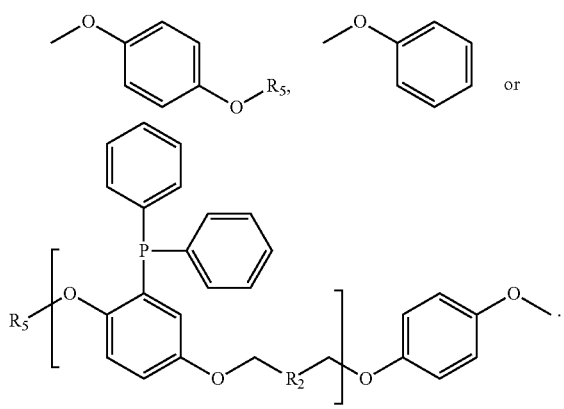

7. The laminated substrate according to claim 1, further comprising a flame retardant compound, wherein the flame retardant compound is selected from the group consisting of resorcinol dixyl phosphate, melamine polyphosphate, tris(2-carboxyethyl)phosphine, trimethyl phosphate, tris (isopropyl chloride)phosphate, Dimethyl-methyl phosphate, bisphenol biphenyl phosphate, ammonium polyphosphate, hydroquinone-bis-(biphenyl phosphate) and bisphenol A-bis-(biphenyl phosphate).

8. The laminated substrate according to claim 1, wherein the accelerating agent is selected from the group consisting of boron trifluoride amine complex, 2-ethyl-4-methylimidazole, 2-methylimidazole, 2-phenylimidazole, ethyltriphenylphosphonium chloride (II), 4-dimethylaminopyridine, liquid bromine-terminated butadiene rubbers, cobalt (II) bisacetylacetonate, cobalt (III) triethoxysilane, Tributylamine and diazabicyclo [2,2,2] octane.

9. The laminated substrate according to claim 1, further comprising a inorganic filler, wherein the inorganic filler is selected from the group consisting of silicon dioxide, aluminum oxide, aluminum hydroxide, magnesium oxide, magnesium hydroxide, calcium carbonate, aluminum nitride, boron nitride, aluminum silicon carbide, silicon carbide, titanium dioxide, zinc oxide, zirconium oxide, Barium, magnesium carbonate, barium carbonate, mica, talc, and graphene.

10. The laminated substrate according to claim 1, further comprising a solvent, wherein the solvent is selected from the group consisting of acetone, butanone, propylene glycol methyl ether, propylene glycol methyl ether acetate, dimethylethyl amine and cyclohexanone.

\* \* \* \* \*